United States Patent [19]
Berkowitz

[11] Patent Number: 5,831,278
[45] Date of Patent: Nov. 3, 1998

[54] THREE-TERMINAL DEVICES WITH WIDE JOSEPHSON JUNCTIONS AND ASYMMETRIC CONTROL LINES

[75] Inventor: Stuart J. Berkowitz, Redwood City, Calif.

[73] Assignee: Conductus, Inc., Sunnyvale, Calif.

[21] Appl. No.: 616,551

[22] Filed: Mar. 15, 1996

[51] Int. Cl.$^6$ .................. H01L 29/06; H01L 31/0256; H01L 39/22; H03K 17/92
[52] U.S. Cl. .................. 257/31; 257/36; 257/39; 505/162; 505/170; 505/832; 505/859; 505/861; 326/3; 327/367; 327/528; 365/162
[58] Field of Search .................. 257/36, 39; 505/162, 505/170, 832, 857, 858, 859, 860, 861, 865; 326/3; 327/364, 528; 365/162

[56] References Cited

U.S. PATENT DOCUMENTS

| | | | |
|---|---|---|---|
| 3,643,237 | 2/1972 | Anacker | 505/832 |
| 3,758,795 | 9/1973 | Anacker et al. | 326/3 |
| 3,784,854 | 1/1974 | Herrell | 505/861 |
| 3,886,382 | 5/1975 | Cain | 505/861 |
| 3,913,027 | 10/1975 | Zappe | 327/528 |
| 3,943,383 | 3/1976 | Hamel | 505/861 |
| 4,423,430 | 12/1983 | Hasuo et al. | 326/3 |
| 5,106,823 | 4/1992 | Creuzet et al. | 327/528 |
| 5,162,298 | 11/1992 | Chaudhari et al. | 257/33 |
| 5,347,143 | 9/1994 | Schroder | 505/832 |
| 5,358,928 | 10/1994 | Ginley et al. | 505/832 |
| 5,696,392 | 12/1997 | Char et al. | 257/31 |

OTHER PUBLICATIONS

Kadin, A.M., "Duality and Fluxonics in Superconducting Devices," *J. Appl. Phys.*, (68)11, (Dec. 1990), pp. 5741–5749.

Broom, R.F., Kotyczka, W., & Moser, A., "Modeling of Characteristics for Josephson Junctions Having Nonuniform Width or Josephson Current Density," *IBM J. Res. Develop.*, 24(2), pp. 178–187, (Mar. 1980).

Gerdemann, R., Alff, L., Beck, A., Froehlich, O.M., Mayer, B., & Gross, R., "Josephson Vortex–Flow Transistors Based on Parallel Arrays of $Yba_2Cu_3O_{7-x}$ Bicrystal Grain Boundary Junctions," *ASC '94* (Oct. 1994).

Gerdemann, R., Bauch, T., Frohlich, O.M., Alff, L., Beck, A., Koelle, D., & Gross, R., "Asymmetric high temperature superconducting Josephson vortex–flow transistors with high current gain," *Appl. Phys. Lett.*, 67(7), 1010–1012 (Aug. 1995).

Gueret, P., Moser, A., & Wolf, P., "Investigations for a Josephson Computer Main Memory with Single–Flux–Quantum Cells," *IBM J. Res. Develop.*, 24(2), 155–166, (Mar. 1980).

(List continued on next page.)

*Primary Examiner*—Mahshid D. Saadat
*Assistant Examiner*—Allan R. Wilson
*Attorney, Agent, or Firm*—Merchant, Gould, Smith, Edell, Welter & Schmidt, P.A.

[57] ABSTRACT

A three-terminal device constructed from a Josephson junction with one or more asymmetric control lines is disclosed. The device is constructed with high temperature superconducting materials. The junction can be a bicrystal, SNS (Superconducting-Normal-Superconducting) or any other type of high temperature superconductor junction. The control line is either a conducting or superconducting material which is electrically isolated from the junction but inductively coupled into the junction. A portion of the control line is approximately directly above the junction and has current which at least partially flows parallel or nonparallel to current flowing across the junction. The control line current alters the magnetic field within the junction which changes the critical current of the junction. The junction is in a superconducting or resistive state depending on whether the bias current of the junction is greater than or less than the control current. Logic gates, including an XOR gate, are formed using this device and one or more control lines.

24 Claims, 9 Drawing Sheets

OTHER PUBLICATIONS

Matisoo, J., "Overview of Josephson Technology Logic and Memory," *IBM J. Res. Develop.*, 24(2), 113–129 (Mar. 1980).

Mizugaki, Y., Nakajima, K., & Yamashita, T., "Flip–flop circuits using dc–biased coupled–SQUID gates," *Research Institute of Electrical Communications*, (preprint, date uncertain, est. 1995).

Zhang, Y.M., Winkler, D., Nilsson, P.A., Claeson, T., "Flux–flow transistors based on long $Yba_2Cu_3O_{7-x}$ bicrystal grain boundary junctions," *Appl. Phys. Lett*, 64(9), 1153–1155 (Feb. 1994).

Koelle, D., Kleiner, R., Ludwig, F., Miklich, A.H., Dantsker, E., & Clarke, J., "Asymmetric $YBa_2Cu_3O_{7-x}$ dc SQUID: A three terminal device with current gain at 77K," *Appl. Phys. Lett.*, 66(5) 640–642 (Jan. 1995).

Raissi, F., & Nordman, J.E., "Josephson fluxonic diode," *Appl. Phys. Lett.*, 65(14), 1838–1840 (Oct. 1994).

Workpart Summaries, European Union ESPRIT Basic Research Project 7100 and the Bundesminister for Forschung and Technologie (project no. 13N6434) Report, 1994.

Rosenthal et al.. "Flux focusing effects in panar thin–film grain–boundary Josephson junctions," *Appl. Phys. Lett.*, 59(26) 3482–3484 (Dec. 1991).

Solymar, L., "Superconductive Tunnelling and Applications," *Wiley–Interscinece*, 247–248 (1972).

Berman, D. et al., "Discrete Superconducting Vortex Flow Transistors," *IEEE Trans. on Appl. Superconductivity*, vol. 4, No. 3, (Sep. 1994), pp. 161–168.

Bock, R.D., "Influence of induced magnetic fields on the static properties of one–dimensional parallel Josephson–junction arrays," vol. 49, No. 14, *Phys. Rev. B*, (Apr. 1994), p. 10009–10012.

Fulton, T.A., et al., "The Flux Shuttle—A Josephson Junction Shift Register Employing Single Flux Quanta," *Proc. of the IEEE*, 61(1) (Jan. 1983), pp. 28–35.

Burns, M. J., et al., "Transport Measurements of Grain Boundary Flux–Flow Transistors," *Bull. Am. Phys. Soc*, 37, 563 (Mar. 1992).

Zhang et al., "RF Characterization of Josephson Flux–Flow Transistors: Design, Modeling, and On–Wafer measurement," IEEE Transactions on Applied Superconductivity, vol. 5 No. 2, pp. 3385–3388, Jun. 1995.

Gerdemann et al., "Josephson Vortex–Flow Transistors Based on Parallel Arrays of YBa2Cu3O7–x Bicrystal Grain Boundary Junctions," IEEE Transactions on Applied Superconductivity, vol., 5, No. 2, pp. 3292–3295, Jun. 1995.

Martens et al. "The RF Performance of Long Junction Active Devices Using TlCaBaCuO Step Edge Structures," IEEE Transactions on Applied Superconductivity, vol. 2, No. 2, pp. 74–78, Jun. 1992.

Herrell et al. "Self–Resetting Logic Circuit", IBM Technical Disclosure Bulletin, vol. 17, No. 4, pp. 1204–1205, Sep. 1974.

Gheewala, "Control of Resonance Amplitude for Josephson Logic", IBM Technical Disclosure Bulletin, vol. 24, No. 1A, pp. 270–272, Jun. 1981.

Gheewala, "One Device AND Gate", IBM Technical Disclosure Bulletin, vol. 21, No. 11, pp. 4697–4698, Apr. 1979.

Basavaiah et al., "Obtaining Improved Josephson Gate Characteristics for Use in Logic Circuits", IBM Technical Bulletin, vol. 16, No. 5, pp. 1464–1465, Oct. 1973.

Schuenemann, "Complementary Current Switch Logic", IBM Technical Disclosure Bulletin, vol. 17, No. 8, p. 2447, Jan. 1975.

Herrell, "NOR–OR Gate for Josephson Tunneling Memory", IBM Technical Disclosure Bulletin, vol. 17, No. 1, pp. 261–263, Jun. 1974.

Jutzi, "Josephson Logic Gate", IBM Technical Disclosure Bulletin, vol. 15, No. 12, p. 3899, May 1973.

JJ

CL (SYM)

JJ

CL (ASYM)

THREE-TERMINAL DEVICES WITH WIDE JOSEPHSON JUNCTIONS AND ASYMMETRIC CONTROL LINES

STATEMENT OF GOVERNMENT INTEREST

The U.S. Government has a paid-up license on this invention and the right in limited circumstances to require the patent owner to license others on reasonable terms.

FIELD OF THE INVENTION

This invention relates generally to three-terminal superconducting devices, and more particularly to three-terminal superconducting devices with current gain.

BACKGROUND OF THE INVENTION

Three-terminal devices, such as the transistor, have been vital in the development of modern electronics. A three-terminal device has an input, an output, and an isolated gate and is characterized by current gain (i.e. the output current is greater than the input current). With the development of superconducting devices, especially those using high temperature superconductors, there has been a desire to create superconducting three-terminal devices for use in logic gates and digital circuitry. Semiconductor three-terminal devices operate by capacitive coupling to the flow of electrons via an electric field. However, this capacitive coupling to the flow of electrons has not produced gain in superconductor devices. Rather, the superconductor three-terminal devices have been demonstrated by inductively coupling to the flow of magnetic flux in the superconductor. For a more detailed discussion the reader is referred to A. M. Kadin, "Duality and Fluxonics in Superconducting Devices", *J. Appl. Phys.*, 68, 5741 (1990), which is herein incorporated by reference. This approach fully utilizes the superconductor's unique magnetic properties.

Superconductors can be roughly divided into two categories based upon the type of material used in the superconductor. The first type, often referred to as low temperature superconductors, were discovered early in this century. These superconducting materials are typically metals or metal alloys. Such materials become superconducting at a critical temperature, $T_c$, that is near the boiling point of liquid helium (4.2 K). The highest $T_c$ of any of these materials is about 23 K. Therefore, to become superconducting these materials must be cooled by liquid helium which has a boiling point of 4.2 K or by a refrigeration system capable of maintaining the material below its critical temperature. This is less than ideal because liquid helium is an expensive and nonrenewable resource with a low heat capacity, and refrigeration systems capable of reaching the desired temperature are unavailable or extremely expensive.

In 1986, Bednorz and Mueller discovered a new set of superconducting materials consisting of certain metal oxides. These materials are now referred to as high temperature (or high-$T_c$) superconductors. A number of these materials have critical temperatures above the boiling point of liquid nitrogen (77 K) and some samples have even demonstrated critical temperatures over 100 K. One of the most commonly utilized high temperature superconductors is $YBa_2Cu_3O_{7-x}$, which is often called YBCO. YBCO has a critical temperature of about 90 K. The advantage of high temperature superconductors like YBCO over the low temperature superconductors is that they can be cooled by liquid nitrogen which is less expensive than liquid helium and has a much higher heat capacity than liquid helium. Alternatively, they can be cooled using relatively low cost refrigeration systems. However, because they are ceramic materials, they present new challenges due to their anisotropy and the difficulty of avoiding defects in their crystalline structure.

One of the most useful properties of superconductors for the development of operable or functional devices is the Josephson effect. The Josephson effect occurs through boundaries between superconducting regions called Josephson junctions. One aspect of the Josephson effect is that a current through a Josephson junction that does not exceed a certain limit, called the critical current, will have no accompanying voltage drop across the junction. This is sometimes referred to as the 'superconducting' state. Current through the junction which is above the critical limit, however, does have a corresponding voltage drop. Under these conditions, the junction is considered to be in the 'resistive' state.

The critical current of the junction is temperature and field dependent. Circulating supercurrents or vortices due to superconducting electrons flow through the junction region to screen an applied magnetic field from the interior of the Josephson junction just as if the barrier itself were weakly superconducting. However, just as with any other superconductor, a magnetic field or an increase in temperature can weaken the supercurrent transport mechanism through the junction. Thus, the critical current can be altered by either changing the magnetic field through the junction or increasing the temperature of the junction.

In low temperature superconductors the boundaries are typically formed by depositing two layers of superconductor separated by a layer of an insulator on a substrate and then patterning the desired device. These SIS junctions generally have a flow of electrons through the junction perpendicular to the plane of the substrate. Alternatively, a severely restricted superconducting region, commonly referred to as a "weak link" or "nanobridge" junction can be patterned between the two superconducting regions. In this case, the flow of electrons through the junction is parallel to the substrate. Tri-layer SIS junctions are preferred for low temperature superconductors.

The high temperature superconductors, unlike their low temperature counterparts, are ceramics. Unlike their metal and metal alloy counterparts which are isotropic, most of the high temperature superconductors are highly anisotropic. This introduces several issues not present in the low temperature superconductors. First, because of their crystalline nature and anisotropy, Josephson junctions form at boundaries in the grain of the crystal growth. Second, when high temperature superconductors are deposited on a substrate they are typically deposited with an orientation that results in current flow preferentially parallel to the plane of the substrate. Third, SIS junctions are difficult to realize in high temperature superconductors because of the difficulty of fabricating very thin insulating layers. The Josephson effect is limited to junctions that have a thickness on the order of the coherence length of the superconducting electrons which does not present an obstacle for low temperature superconductors, which typically use an insulating layer of about 30 angstroms thick aluminum oxide. A very thin, uniform aluminum oxide insulating layer is obtained by oxidation of an aluminum layer. High temperature superconductors have a coherence length of 10–30 angstroms. With high temperature superconductors, however, the barrier layer must support epitaxial growth of the second layer of superconductor. Electrolytic methods have not been reliably developed, and it is very difficult to deposit barrier layers having thicknesses on the order of the coherence length of the high temperature superconductors (about 10–30 angstroms) using standard methods. While degradation of the surface of the superconductor might provide an insulating surface, it is not practicable because the fabrication of high temperature superconductor layers requires annealing the ceramic material in an oxygen atmosphere at high temperatures, typically about 900° C. which reactivates the surface, thereby making unreliable and irreproducible junctions. These differences in the materials necessitate development of a new approach to the realization of a three-terminal device in high temperature superconductors.

In response to these differences, new junction constructions were developed. Among these new constructions are bicrystal junctions, SNS (Superconducting-Normal-Superconducting) junctions and step-edge junctions.

Bicrystal junctions are constructed by, first, creating a substrate that has a grain boundary, typically by fusing two single-crystal substrates with the crystal orientation of one rotated a desired amount from the orientation of the other. Then, high temperature superconducting material is epitaxially deposited on the substrate such that the superconducting material also exhibits this grain boundary. The grain boundary acts as a Josephson junction connecting two superconducting materials of different grains. This method of creating Josephson junctions is described in more detail in Chaudhari et al., U.S. Pat. No. 5,162,298 which is incorporated herein by reference.

SNS junctions consist of two superconducting regions separated by a normal metal or weakly superconducting region. Use of materials such as metallic oxides to form these junctions provides a junction layer that is compatible with oxide superconductor processing techniques and therefore will not degrade during production of high temperature superconductor devices. These junctions are described in more detail in the copending application of Char, et al., U.S. Ser. No. 08/345,318, which is incorporated herein by reference. Neither the bicrystal nor the SNS junctions are formed perpendicular to the substrate but are rather partially or entirely parallel to the plane of the substrate. This horizontal configuration is distinguished from the typical vertical configuration of the low temperature superconductors and has its own properties which are useful in the present invention.

Another factor to consider in the operation of Josephson junctions is the width of the junction. "Wide" Josephson junctions are junctions that are much wider than the size of the magnetic vortex, $\lambda_J$ in the Josephson junction. The width of the wide Josephson junction, W, must satisfy the following relation:

$$W > \lambda_J = \sqrt{\frac{\hbar}{2eJ_d\mu_0(2\lambda_L + d)}}$$

where $J_c$ is the critical current density of the Josephson junction, $\lambda_L$ is the London penetration depth of the superconducting electrons, and d is the thickness of the junction.

Josephson junctions have been incorporated in a number of superconducting devices. One of the most recognizable is the SQUID (Superconducting Quantum Interference Device). A SQUID typically consists of one or two Josephson junctions connected in a superconducting loop. Josephson junctions have also been used in three-terminal devices. Some of these devices are based upon the manipulation of the magnetic field in the Josephson junction to switch the junction from a superconducting to a resistive state and vice versa. One method of changing the magnetic field in the Josephson junction is by magnetically coupling the junction to a nearby current-carrying control line. The current in the control line creates a magnetic field that is coupled into the junction, thereby altering the magnetic field of the junction and changing the critical current of the junction.

Control lines have been used in this way in both low and high temperature superconductor devices. In low temperature devices the control line is typically placed above or below the plane of the junction with the control line running essentially perpendicular to the plane of the junction. Such devices are described in more detail in R. F. Bloom et al, "Modeling of Characteristics for Josephson Junction Having Nonuniform Width or Josephson Current Density", *IBM J. Res. Develop.*, 24, 178 (1980). In devices of this type, the current through the control line flows perpendicular to the current across the junction.

In previous high temperature superconductor three-terminal devices the geometry of the control line is different from those of the low temperature devices because the Josephson junction is no longer perpendicular to the substrate but rather parallel with the substrate. A previous high temperature superconductor device was constructed with a bicrystal grain boundary and a control line that ran parallel to the grain boundary. Such a device is described in Y. M. Zhang, et al., "Flux-flow Transistors Based on Long $YBa_2Cu_3O_{7-\delta}$ Bicrystal Grain Boundary Junctions", *Appl. Phys. Lett.* 64, 1153 (1994). A control line in which the current runs perpendicular to the current flow in the junction is called a 'symmetric' control-line because it induces field symmetrically along the width of the junction. In the geometry described above, the control current flows perpendicular to the junction current just as in the low temperature devices. Current gain of less than 2.0 was measured for a 30 µm wide Josephson junction using the described configuration. The present invention provides an improved three-terminal device design having a control line configuration which increases the current gain over the prior art designs.

An application of the superconductor three-terminal device is in logic gates. The junction is biased with a current, $I_b$, which is less than the critical current of the junction, $I_c$. The current flowing through the control line, $I_{CL}$, will alter the critical current of the junction to a new value, $I_c'$. The exact amount of the alteration in the critical current is dependent on a number of factors including the effectiveness of the coupling between the control line and the Josephson junction and the geometry of the junction and control line. If the new critical current, $I_c'$ is less than the bias current, $I_b$, the junction switches from the superconducting state to the resistive state. To restore the device to its superconducting state the control current need only be removed which restores the critical current of the junction to its original value, $I_c$. Current gain can be realized through this type of device. The gain is defined as the change in the critical current due to a change in the control current, $G=dI_c/dI_{CL}$.

SUMMARY OF THE INVENTION

This invention provides a new control line geometry to be used with a Josephson junction in a three-terminal device. This geometry provides significantly higher gain than that found in the known symmetric control line configuration of the prior art.

According to one embodiment of the invention, there is provided a three-terminal device which is constructed from a substrate upon which high temperature superconducting material has been deposited to form a wide Josephson junction.

At least one control line is deposited above the junction. A portion of the control line should be directly above or below or nearly directly above or below the Josephson junction to ensure good magnetic coupling between the control line and the Josephson junction. This portion of the control line should also be at least partially perpendicular to the Josephson junction so that current flowing through the control line will be at least partially parallel to current flowing across the Josephson junction. This configuration of the control line is termed "asymmetric" because it induces field asymmetrically along the width of the junction.

There should be an insulating layer between the Josephson junction and the control line. The thickness of this layer should be such that the control line is electrically isolated from the Josephson junction but still magnetically coupled to the junction.

According to one embodiment of the invention, the Josephson junction is of the bicrystal type. This type of junction is constructed with a substrate that has a grain boundary. Superconducting material is epitaxially deposited on this substrate. The grain boundary in the substrate causes a grain boundary to appear in the superconducting material. This grain boundary then forms the Josephson junction between the two superconducting regions of differing grains.

According to another embodiment of the invention, the Josephson junction is of the SNS or SIS type in a planar geometry. In this type of junction the barrier between the two superconducting regions comprises a normal metal or weakly superconducting material, preferably a material which can withstand the rigors of superconducting oxide processing.

According to another embodiment of the invention, a superconducting ground plane is deposited on a substrate. A dielectric layer is deposited epitaxially on the ground plane. A wide Josephson junction is formed on the dielectric. At least one control line is formed on the Josephson junction, with at least a portion of the control line being at least partially parallel to the flow of current through the junction. The ground plane lowers the junction and parasitic inductances and enables a much faster device performance.

According to another aspect of the invention, the three-terminal device is operated by biasing the Josephson junction with a current $I_b$ which is less than the critical current, $I_c$. As long as $I_b$ remains less than $I_c$ then the junction remains in a superconducting state and there is no voltage drop across the junction.

A current, $I_{CL}$, can be applied to the control line. Because the control line is near the Josephson junction, the control current will induce a magnetic field in the junction. This magnetic field will then alter the critical current of the junction to a new value, $I_c'$. If $I_b$ is greater than $I_c'$ the junction will become resistive and there will be a voltage drop across the junction. The junction can be returned to its superconducting state by removing the control current thereby eliminating the magnetic field induced by the control current and restoring the critical current of the junction to its former value.

A further embodiment of the invention is the use of the three-terminal device described above as a logic gate. The superconducting and resistive states can be utilized as logical 0 and 1 states in logic gates and digital circuitry. Depending upon the number of junctions and control lines and the direction of the current through the control lines, INVERT, AND, OR, NAN and other gates may be created.

One particular embodiment of this invention is an XOR gate formed from this device. In this embodiment two control lines are used. These two control lines must be near one another or in geometrically similar positions so that the same amount of current flowing through each line will produce nearly the same magnetic field in the Josephson junction.

In the XOR gate, current sources for the control lines should be provided so that a signal from the current source corresponding to a logical 1 value which flows through one line will produce a magnetic field in the junction having the opposite polarity but same magnitude as a field induced in the junction by a similar signal flowing through the other line. In addition, the signal current must have a magnitude such that application of a signal in one control line will cause the Josephson junction to become resistive.

If these conditions are met then the XOR gate is complete. A signal in neither line will leave the junction in the superconducting "0" state. A signal in both lines will cancel because of the opposing current flow, again leaving the junction in the superconducting "0" state. A signal in one line or the other, but not both, will cause the junction to enter the resistive "1" state.

These aspects of the invention are only exemplary of embodiments of configurations used to implement structures that practice the broad principles of this invention. It will be understood that those skilled in the art may readily perceive yet other variations of the invention not specifically described above or in the following specification, but clearly included within the scope of the appended claims.

BRIEF DESCRIPTION OF THE DRAWINGS

Referring to the Drawing wherein like numerals represent like parts throughout the several views:

FIG. 3 illustrates various alternate configurations of the control line orientation relative to the device of the type illustrated in FIGS. 1 and 2 wherein;

DETAILED DESCRIPTION OF THE PREFERRED EMBODIMENT

Figure 1:
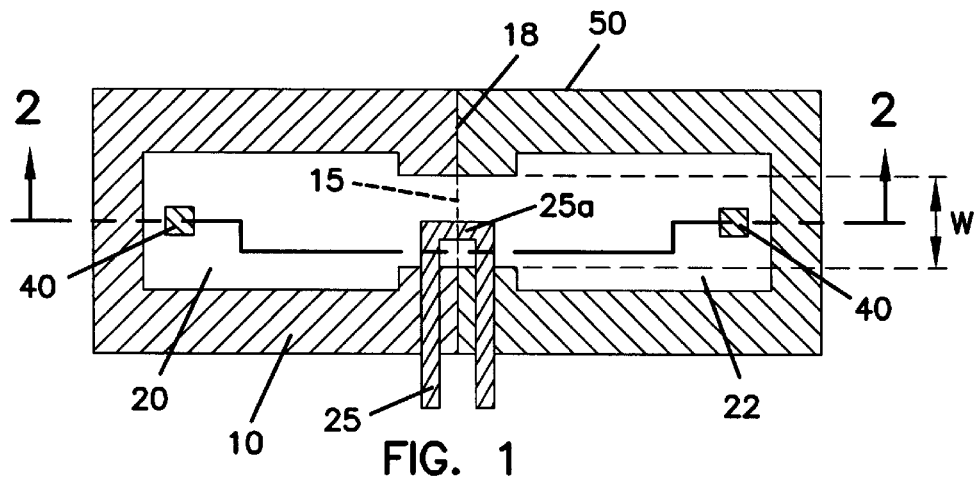
FIG. 1 is a scaled diagrammatic representation in top view of a first embodiment of a three-terminal device with a bicrystal Josephson junction constructed according to the principles of this invention, wherein the insulating layer over the YBCO is not visible.
Figure 2:
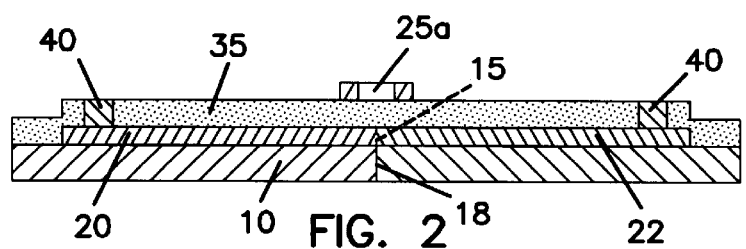
FIG. 2 is a cross-sectional view, not drawn to scale, of the three-terminal device of FIG. 1, generally taken along the Line 2—2 of FIG. 1 and including an upper insulating layer.

A preferred embodiment of a three-terminal device configured according to the principles of this invention is generally illustrated at 50 in FIGS. 1 and 2. FIG. 1 is an approximately scaled enlarged top view of the device and FIG. 2 is an enlarged cross-sectional view of the device taken generally along the line 2—2 of FIG. 1. FIG. 2 is not drawn to scale, but is instead drawn to best illustrate the details of the structure. The device of this preferred embodiment is fabricated from 200 nm thick c-axis oriented YBCO films deposited on a 0.5 mm thick strontium titanate (STO) bicrystal substrate with a 23_ misorientation angle. It will be appreciated that the principles of this invention apply to other known high temperature superconductors, such as, BiSrCuCaO, TlBa$_2$Cu$_3$O$_{7-\delta}$, and RBa$_2$Cu$_3$O$_{7-\delta}$, where R is any rare earth element except Tb, Pr, or Ce. and to other substrates, such as yttria stabilized zirconia (YSZ), sapphire, NdGaO$_3$ and MgO.

The bicrystal Josephson junctions of this preferred embodiment are constructed using techniques well-known in the thin film fabrication technology, as well as those in Chaudari et al., U.S. Pat. No. 5,162,298, which is incorporated herein by reference.

This preferred embodiment comprises two regions of superconducting materials 20, 22 that have been deposited on a bicrystal substrate 10. The two superconducting regions 20, 22 are separated by a grain boundary 15 corresponding to the grain boundary 18 in the substrate 10. The grain boundary 15 forms a Josephson junction between the two superconducting regions. In accordance with this invention, the grain boundary 15 between the two superconductors must have a width (W) greater than $\lambda_J$, wherein $$\lambda_J = \sqrt{\frac{\hbar}{2eJ_c\mu_0(2\lambda_L + d)}}$$

where $J_c$ is the critical current density of the Josephson junction, $\lambda_L$ is the London penetration depth of the superconducting electrons, and d is the thickness of the junction. A Josephson junction that satisfies this condition is called a "wide" junction. In a preferred embodiment the width (W) of the bicrystal Josephson junction is 20–30 μm and $\lambda_J$ is about 1 μm. In general, the width of the Josephson junction is greater than 4 times $\lambda_J$, and preferably the width is greater than 10 times $\lambda_J$.

Electrodes 40 are operatively connected to each of the superconducting regions 20 and 22 to provide a path for the input, output, and bias currents of the device. These electrodes may consist of any of a number of different materials known to those skilled in the art and in the preferred embodiment comprise gold, and are connected to the superconductors by methods known to those skilled in the art.

An insulating layer 35 (not shown in FIG. 1) such as SiO$_2$, is deposited over the top of the superconducting regions 20, 22 and in particular over the top of the grain boundary 15. In the preferred embodiment the insulating layer 35 is 200 nm thick. This insulating layer 35 can be of any material in an adequate thickness which will electrically insulate the grain boundary 15 and nearby superconducting regions 20, 22 from any conducting or superconducting material deposited on top of the insulating layer 35. Such electrically insulating materials may include, for example, SiO$_2$, SiO, Sr$_2$AlNbO$_6$, Sr$_2$AlTaO$_6$, STO and polymethylmethacrylate, as well as other materials known to persons skilled in the art of thin film device fabrication. The insulator is preferably epitaxial to the superconductor if a superconducting control line (described below) is to be used. If the control line is not superconducting, the insulator may be omitted or may be any material chemically compatible with YBCO.

A control line 25 is deposited on top of the insulating layer 35. In the preferred embodiment the control line is made of Au and has a thickness of 700 nm and a width of 2–4 μm. The control line 25 can be made from any conducting or superconducting material, including metals, high temperature superconductors, and metal alloys. The ends of the control line 25 are operatively connected to a current source (not shown) for providing current flow therethrough.

A portion of the control line 25a is constructed to lie directly above the Josephson junction to ensure that the maximum flux coupling is obtained between the control line and the junction. In addition, the portion 25a of the control line 25 must be constructed so that some part of the control line current flow near the junction is parallel to or antiparallel with the current flow across the junction. In the preferred embodiment illustrated in FIGS. 1 and 2, the control line perpendicularly crosses the junction; however a perpendicular crossing is not required. Further, the control line may cross the junction at any place along the width of the junction. A control line crossing the Josephson junction as described above is generally referred to as an 'asymmetric' configuration.

Figure 3A:
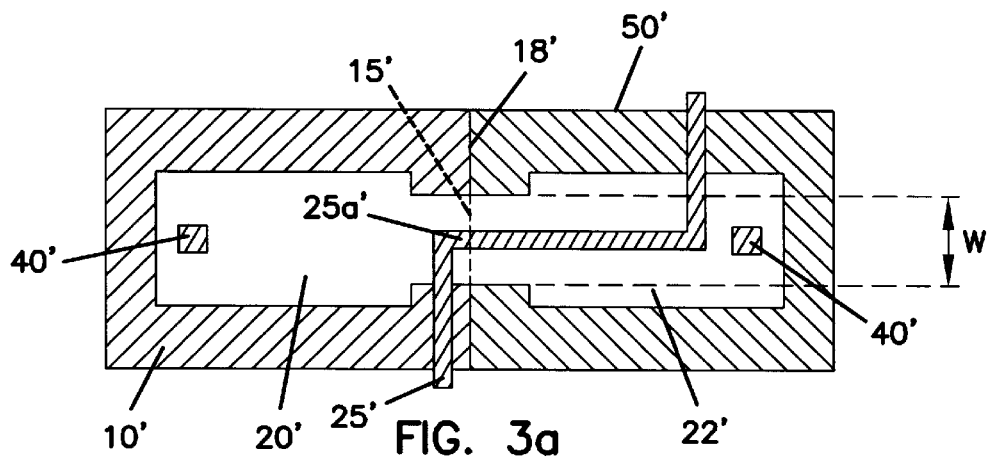
FIG. 3a illustrates a first alternate configuration of the control line.
Figure 3B:
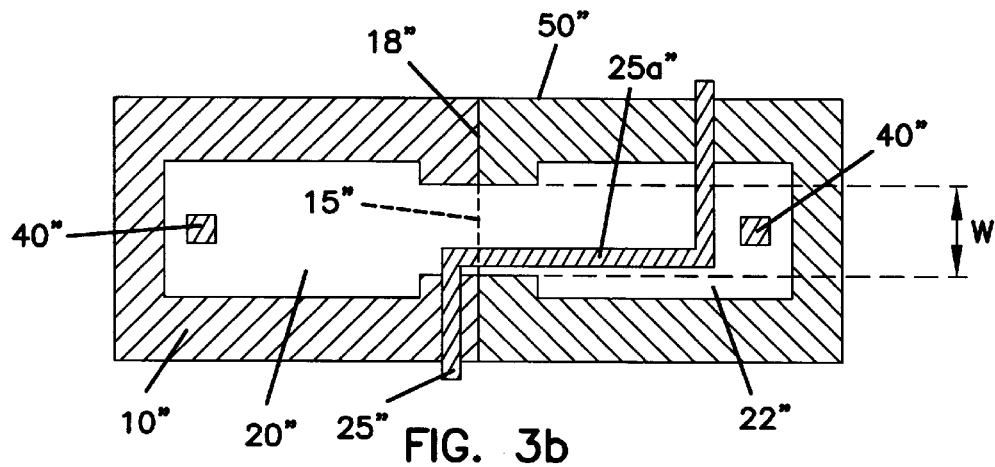
FIG. 3b illustrates a second alternate configuration of the control line.

FIG. 3 illustrates various alternate asymmetric configurations of the control line orientation relative to the Josephson junction. Like portions of the device of FIGS. 1 and 2 are illustrated in FIG. 3 by the same numbers, followed by primed designations. FIG. 3a shows the control line 25' entering from one side of the junction area, crossing the junction near its center, and then exiting the device on the other side of the junction area. FIG. 3b is similar to the FIG.

Figure 3C:
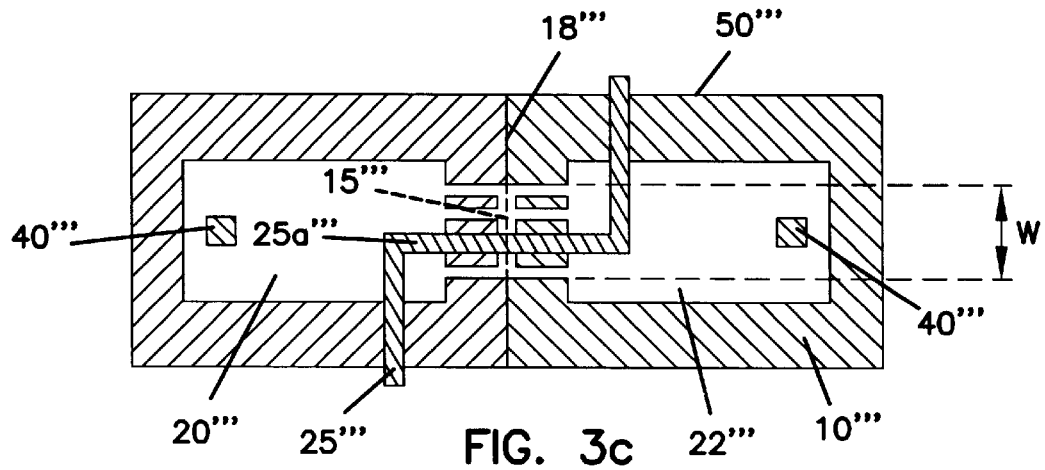
FIG. 3c illustrates a third alternate configuration of the control line.

3a configuration except that the control line 25a'" does not cross in the center of the junction but rather to one side thereof. FIG. 3c illustrates an alternate configuration wherein the control line 25'" configuration relative to the Josephson Junction 15'" is the same as that of FIG. 3a but where the junction feed lines are bifurcated to force more even current distribution at the junction.

Figure 4:
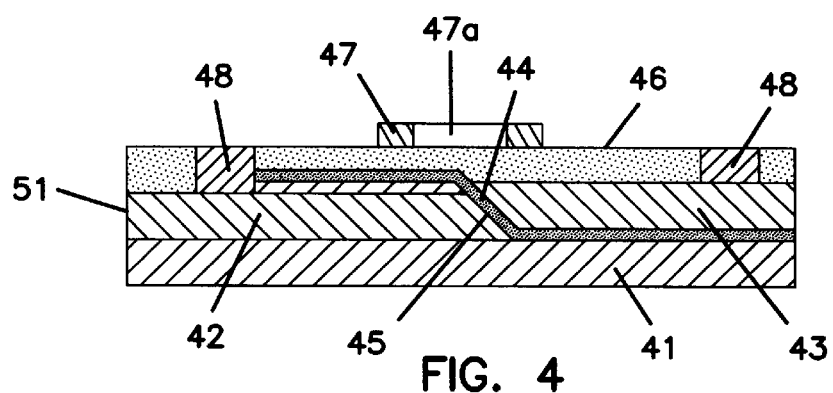
FIG. 4 is a cross-sectional representation, not drawn to scale, of a three-terminal device configured according to the principles of this invention which illustrates use of the invention with an SNS edge Josephson junction.

A second embodiment of a three-terminal device constructed according to the principles of this invention is illustrated in FIG. 4 which shows a cross-sectional view of a three-terminal device 51 constructed with an SNS edge junction. The SNS Josephson junction 45 is formed from a conducting normal metal or weakly superconducting barrier layer 44 sandwiched between two superconducting regions 43 and 42 all deposited on a substrate 41. In this embodiment the layer 44 is comprised of Co-doped YBCO. However, other materials such as Ag, $CaRuO_3$, $SrRuO_3$, Ca-doped YBCO and other metallic oxides having a perovskite structure and a suitable crystal lattice can be used in this layer. Electrodes 48 are appropriately connected to the superconductor regions 42 and 43. The techniques and materials for constructing SNS junctions are further disclosed in the copending patent application of Char et al., U.S. Ser. No. 08/345,318, which is herein incorporated by reference.

Figure 13:
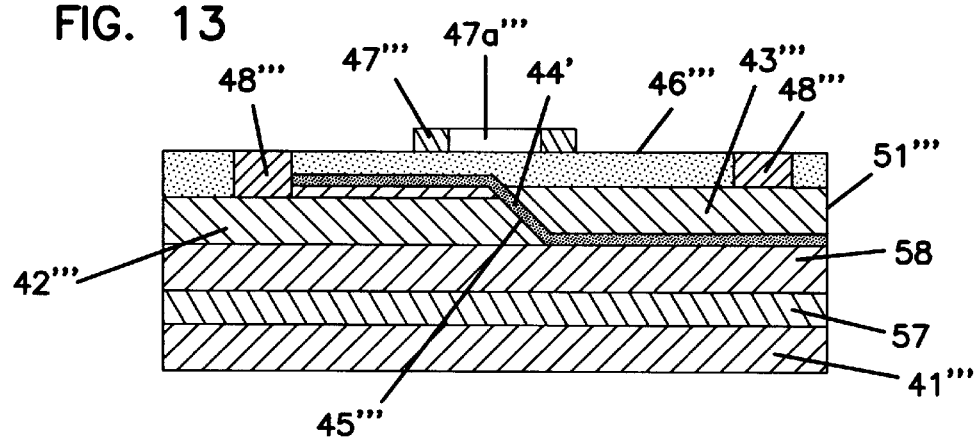
FIG. 13 is a cross-sectional representation, not drawn to scale, of a three terminal SNS edge junction device similar to that of FIG. 4 with an additional ground plane layer, constructed according to the principles of this invention.

An alternate configuration of the SNS edge junction device of FIG. 4 is illustrated in FIG. 13, wherein like elements of FIG. 4 have been designated by like numerals with primed suffixes. The FIG. 13 SNS edge junction structure includes a superconducting ground plane YCBO layer which is first deposited on the substrate 41'" and then covered by an appropriate dielectric layer 58 such as strontium aluminum niobate (SAN) or strontium aluminum tantatale (SAT). The remaining structure illustrated and described with respect to FIG. 4 is then formed on top of the dielectric 58 and groundplane 57 layers, as illustrated in FIG. 13. The ground plane lowers the junction and parasitic inductances, enabling much faster device performance.

The SNS junction geometry differs from the bicrystal junction geometry in at least two important aspects. First, one of the superconducting regions 43 is deposited over the barrier material 44 and, second, the SNS junction 45 is typically only partially vertical. However, the control line is constructed in a similar manner to that in the bicrystal device. An insulating layer 46 is deposited over the superconducting regions 42 and 43 and over the interlayer 44, and the control line 47 is deposited above the insulating layer 46. As with the first embodiment, at least a portion 47a of the control line 47 should be nearly directly above the Josephson junction 45, and it should have a portion above the junction in which current flow through the control line 47 is partially parallel to or antiparallel to current flow across the junction 45.

Another important difference between the bicrystal and the SNS junctions is that the SNS junctions can be much smaller because the magnetic vortex $\lambda_J$ of the SNS junction is much smaller, typically about 0.25 µm, due to higher critical current density. The width of the SNS junction 44 in the preferred embodiment illustrated in FIG. 4 is about 6 µm. The width in general of the SNS junctions of the invention is greater than 4 times $\lambda_J$, that is, greater than 1 µm. Preferably the width of the SNS junction is greater than 10 times $\lambda_J$, that is, greater than 2.5 µm.

Figure 5:
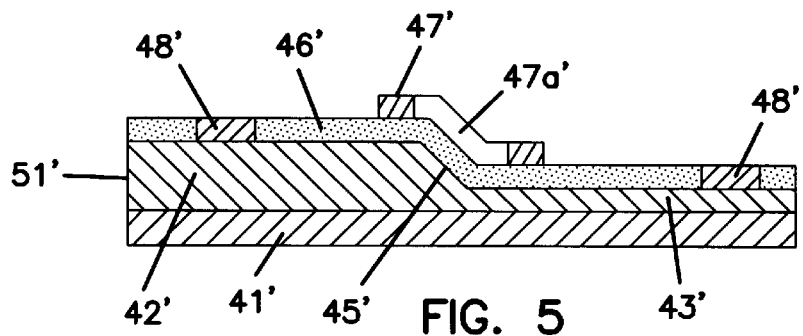
FIG. 5 is a cross-sectional representation, not drawn to scale, of a three-terminal device configured according to the principles of this invention which illustrates use of the invention with a step Josephson junction.
Figure 6:
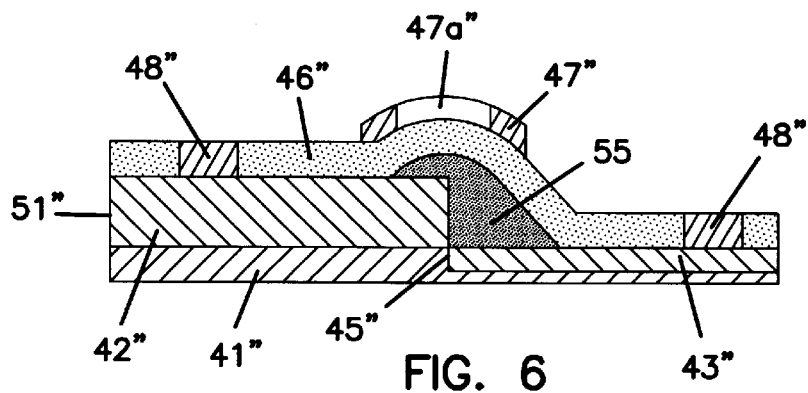
FIG. 6 is a cross-sectional representation, not drawn to scale, of a three-terminal device configured according to the principles of this invention which illustrates use of the invention with an SNS step Josephson junction.

FIG. 5 illustrates a third alternative type of Josephson junction, neither bicrystal nor SNS, applicable to this invention. FIG. 5 illustrates a step junction having two regions of different thicknesses of superconductor 43', 42' and formed on the substrate 41'. The corresponding step between the two superconducting regions comprises the Josephson junction 45'. A control line 47' is deposited over an insulating layer 46' which separates the junction 45' and the control line 47'. FIG. 6 illustrates an SNS step junction three-terminal device configuration 51". As in the FIG. 5 example, there are two superconducting regions 42" and 43" of different thickness formed on the substrate 41". However, in this case a metallic oxide or metal layer 55 deposited over the step region separates the two regions and forms the SNS Josephson junction 45". An insulating layer 46" is formed over the superconducting regions 42" and 43" and junction 45" and a control line 47" is deposited on the insulating layer 46".

While several examples of devices having Josephson junctions of varied configurations have been illustrated in describing a three-terminal device of this invention, it is to be understood that other Josephson junction configurations are included within the scope of this invention. The embodiments described above are simply illustrations of particular exemplary embodiments of devices with which the invention can be used.

In addition, it is to be understood that the reference to the control line as being oriented above or overlying the junction is illustrative only of these particular embodiments. In alternate embodiments, for example, the order of thin film deposition may be reversed and the control line may be physically positioned "below" the junction.

Figure 7:
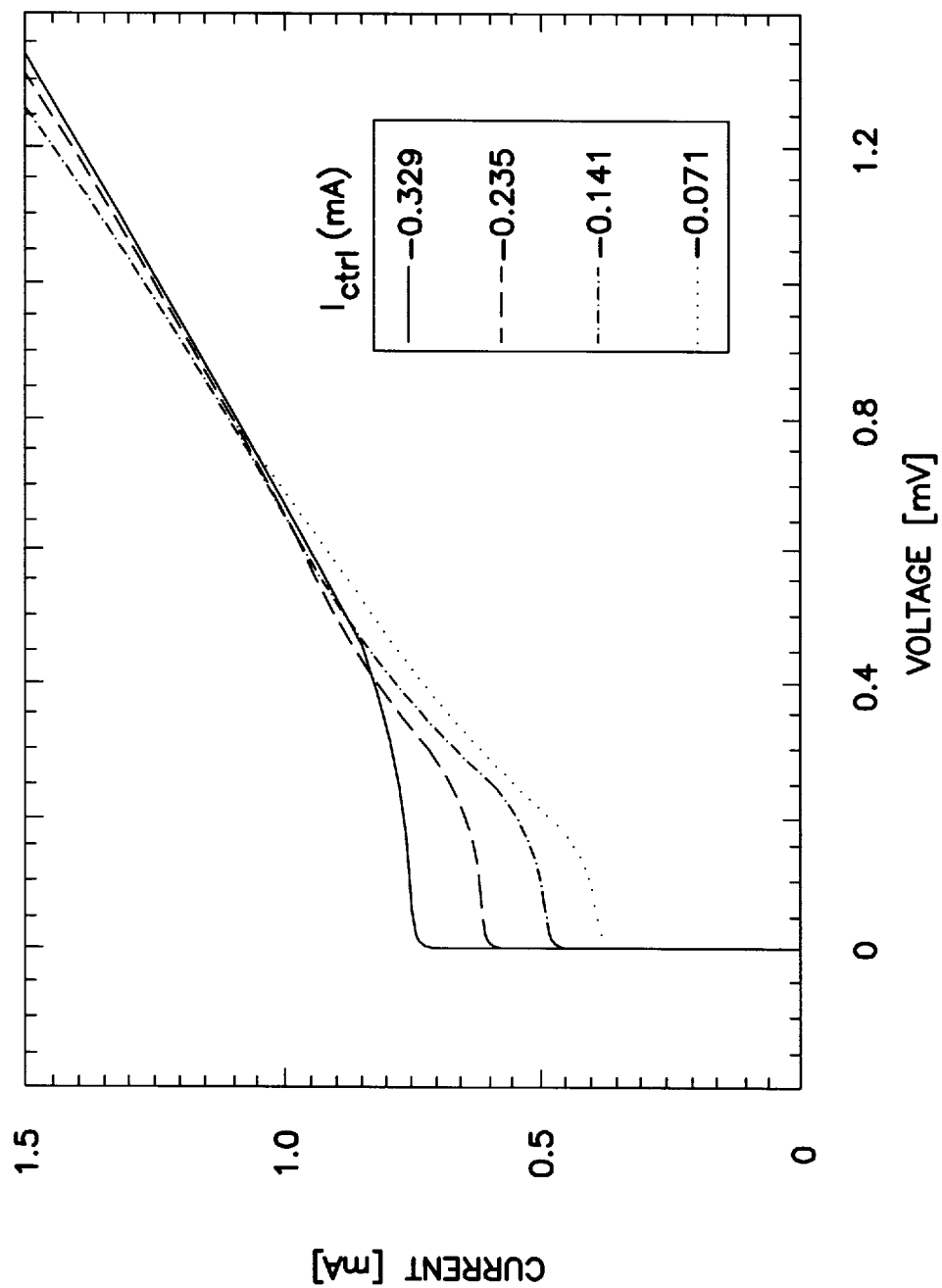
FIG. 7 illustrates a typical plot of current versus voltage for a Josephson junction.

A Josephson junction biased by a current has an I-V characteristic generally as shown in FIG. 7. The FIG. 7 curves were measured on a device having a 20 µm long junction at 30 K, modulated by varying the gate current $I_{cntl}$. During operation the device is biased by a current carried from the electrodes 40 attached to the superconducting regions 20, (42) and 22 (43). For bias currents, $I_b'$ less than the critical current, $I_c$, there is no voltage drop for the device as shown in FIG. 7. This state is often referred to as the 'superconducting' state. However, once the critical current has been exceeded the junction begins to exhibit resistance and the device develops a voltage drop. This is referred to as the 'resistive' state.

Figure 8:
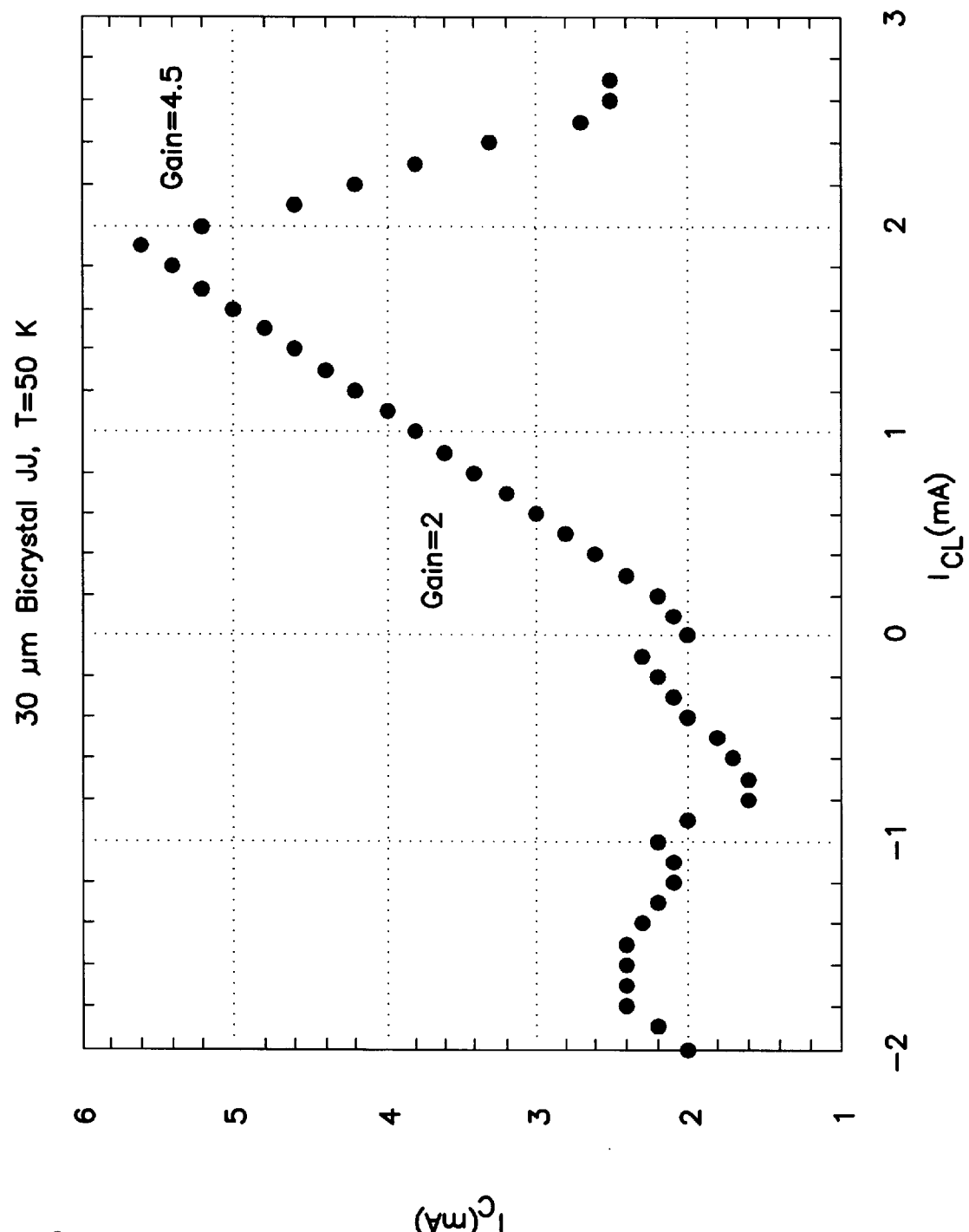
FIG. 8 illustrates a plot of the Josephson junction critical current as a function of the control line current in a three-terminal device of the type configured as in FIG. 1.

The critical current of the junction is dependent on the magnetic field through the junction. The current through the control line, $I_{CL}$, is inductively coupled to the Josephson junction and thereby alters the magnetic field in the junction. The critical current thus becomes a function of the control line current. FIG. 8 shows a plot of critical current versus control line current for a Josephson junction with an asymmetric control line of the type for example illustrated in FIGS. 1 and 2. This graph demonstrates the complex nature of the functional dependence of the critical current on the coupling strength of the control line with the Josephson junction and the geometry of the control line and the junction. Typically, symmetric control lines display symmetric $I_c$ v. $I_{CL}$ behavior. However, as displayed in FIG. 8, asymmetric control lines show an asymmetric behavior.

Figure 9:
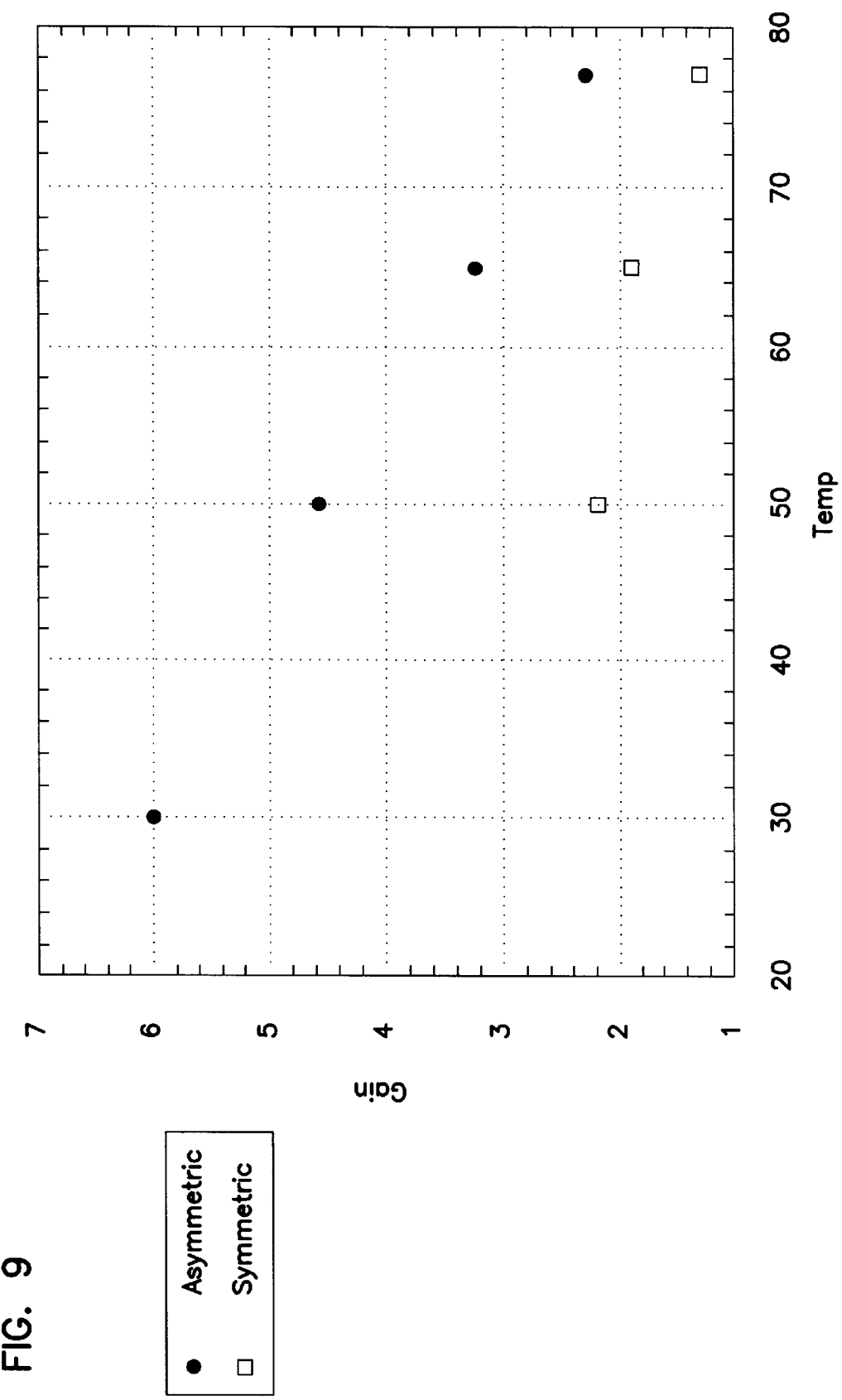
FIG. 9 represents an experimentally measured comparison of the gain for similar three-terminal Josephson junction devices with symmetric and asymmetric control lines respectively.
Figure 10A:
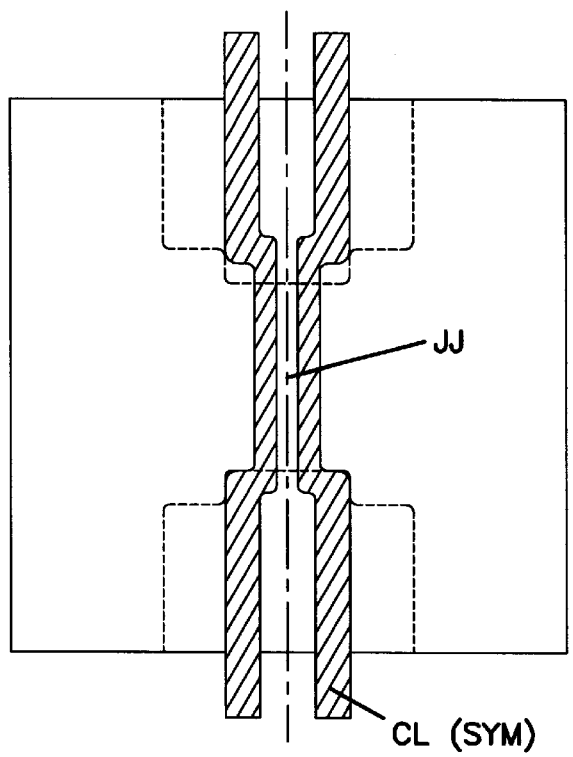
FIG. 10a diagrammatically illustrates a three-terminal Josephson junction device having a symmetrical control line configuration for which experimental data is shown in FIG. 9.
Figure 10B:
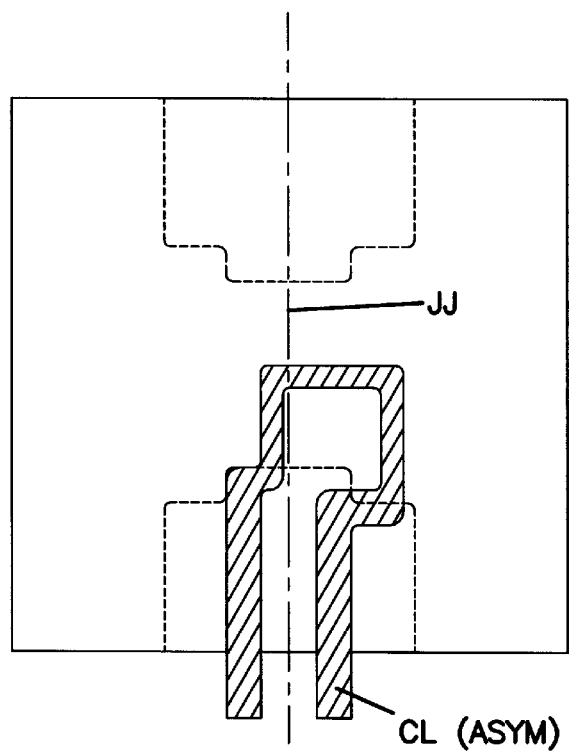
FIG. 10b diagrammatically illustrates a three-terminal Josephson junction device having an asymmetrical control line configuration for which experimental data is shown in FIG. 9.

This "asymmetric" behavior leads to a larger current gain in three-terminal devices than can be found for similar devices having "symmetric" control line configurations. The current gain for such devices is defined as the change in critical current for a given change in control line current, $G=dI_c/dI_{CL}$. FIG. 9 shows a comparison of the gain measurements made at several temperatures for two similar 30 µm bicrystal Josephson junction devices with symmetric and asymmetric control lines respectively as depicted in FIGS. 10a and 10b. The asymmetric control line configuration of FIG. 10b demonstrates a gain of 6 at 30 K. The maximum gain measured for the symmetric control line configuration of FIG. 10a was found to be 2 at a temperature of 50 K.

Below 50 K the symmetric control line device configuration of FIG. 10a shows no increase in gain.

Three-terminal devices incorporating the principles of this invention such as those described above can be used in digital and logic circuits. INVERT, AND, OR, NAND and XOR gates have all been demonstrated.

Figure 11A:
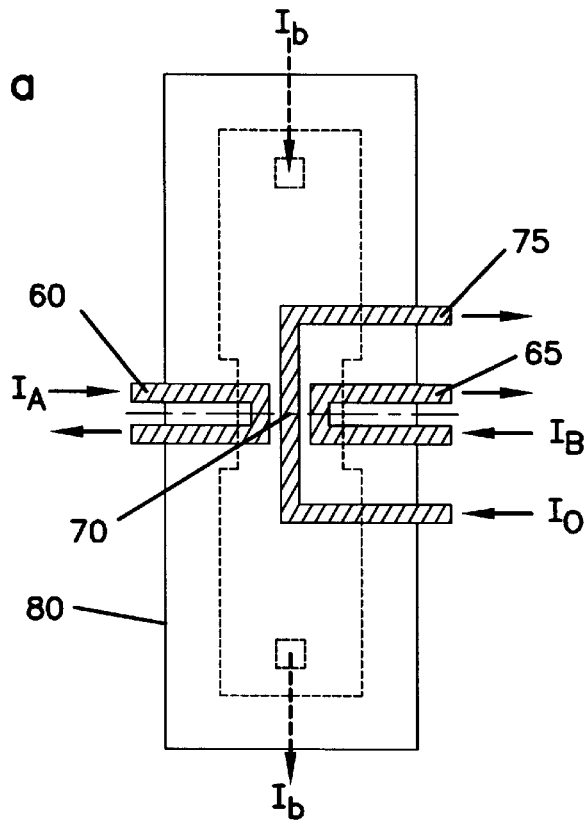
FIG. 11a illustrates an XOR logic gate constructed according to the principles of this invention with two control lines entering and exiting from opposite sides of the junction.
Figure 11B:
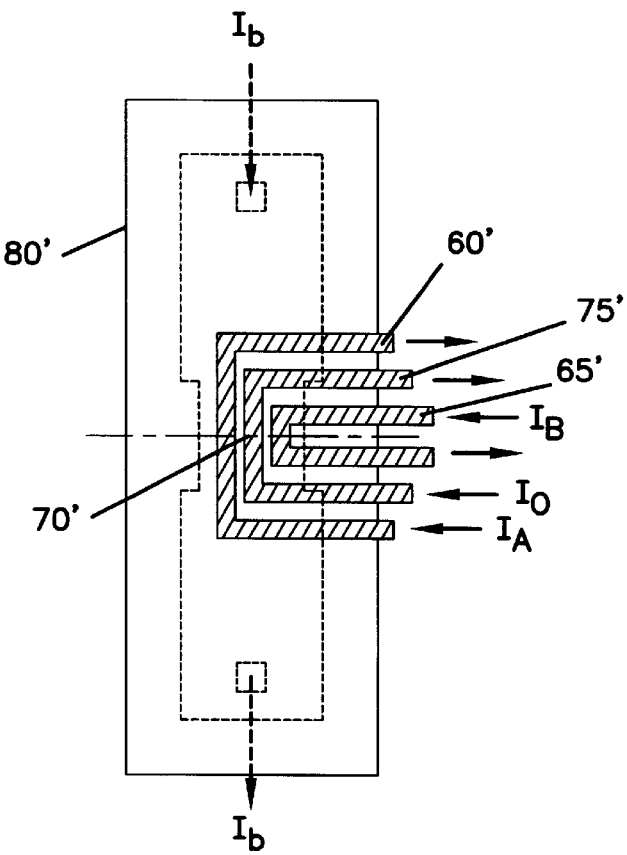
FIG. 11b illustrates a second embodiment of an XOR gate constructed according to this invention with two control lines entering and exiting from the same side of the junction.

An XOR gate 80 can be constructed as shown in FIGS. 11a and 11b. To construct this gate two asymmetric control lines 60, 65 are deposited above the Josephson junction 70. The two control lines can be deposited to approach the junction from opposite sides as shown at 60 and 65 in FIG. 11a, or could be deposited one on top of the other (not illustrated) or slightly offset from one another and approaching the junction 70' from the same side as shown at 60' and 65' in the gate device 80' of FIG. 11b. Alternatively, the two control lines could be deposited one above the junction and the other beneath the junction (not shown). However, the two asymmetric control lines should be in geometrical locations that provide nearly the same inductive coupling into the Josephson junction for the same current in each control line.

The XOR gates 80 of the type illustrated in FIGS. 11a and 11b operate as follows. The two control lines 60, 65 are attached to two ac current sources, A and B, (not shown) respectively. Current flowing from either source indicates a logical "1" state for that source. No current from the source indicates a logical state "0." The Josephson junction is biased with a current, $I_b$. Current from each source must be of sufficient amplitude to alter the critical current of the Josephson junction to a value less than the bias current $I_b$ of the junction. In addition, the current from the two sources should induce magnetic fields in the Josephson junction that are approximately equal in magnitude but opposite in polarity.

Additionally, a dc bias field must be applied to the junction to shift the maximum IC to 0. This can be accomplished in a number of ways, including providing a field line 75 on the top of or near the junction; applying a field to the entire circuit such as by using a solenoid or applying a dc bias to the control line in addition to the ac signal. In FIGS. 11a and 11b, the dc bias field is created by passing a field bias current $I_0$, through the field lines 75 and 75' respectively.

When there is no signal current flowing from sources A or B to control lines 65 or 60, then the Josephson junction 70 is in the superconducting state, a logical "0" state. However, when current flows from source A or B, energizing control lines 65 or 60, but not both, the Josephson junction 70 is switched to the resistive state, a logical "1" state. When current flows through control lines 65 or 60, the magnetic fields induced in the junction 70 by the control line currents cancel, thereby leaving the Josephson junction 70 in the superconducting or logical "0" state. The identical structure can be used as an OR gate by providing current in the two control lines with the same, rather than opposite, polarity.

It will be appreciated by those skilled in the art that similar devices can be created for other logical gates and digital applications. One or more control lines can be used to create such gates in a manner similar to that described above for the XOR gate.

As used in this description and in the appended claims, the term 'three-terminal device' refers to a device with an input terminal, an output terminal, and an isolated gate terminal. Each of these three-terminals may be comprised of one or more components. For example, there may be one or more control lines providing input as described above for the XOR gate embodiment of the invention.

EXAMPLES 1–5

Three-Terminal Devices with Bicrystal Junctions

Eight three-terminal devices with bicrystal Josephson junctions were made as described above and in Chaudari et al. U.S. Pat. No. 5,162,298. The junctions were made on a substrate of strontium titanate with a bicrystal grain boundary. YBCO was epitaxially deposited on the substrate using laser ablation to a thickness of 200 nm. The width of the grain boundary junction was 30 μm.

Figure 12:
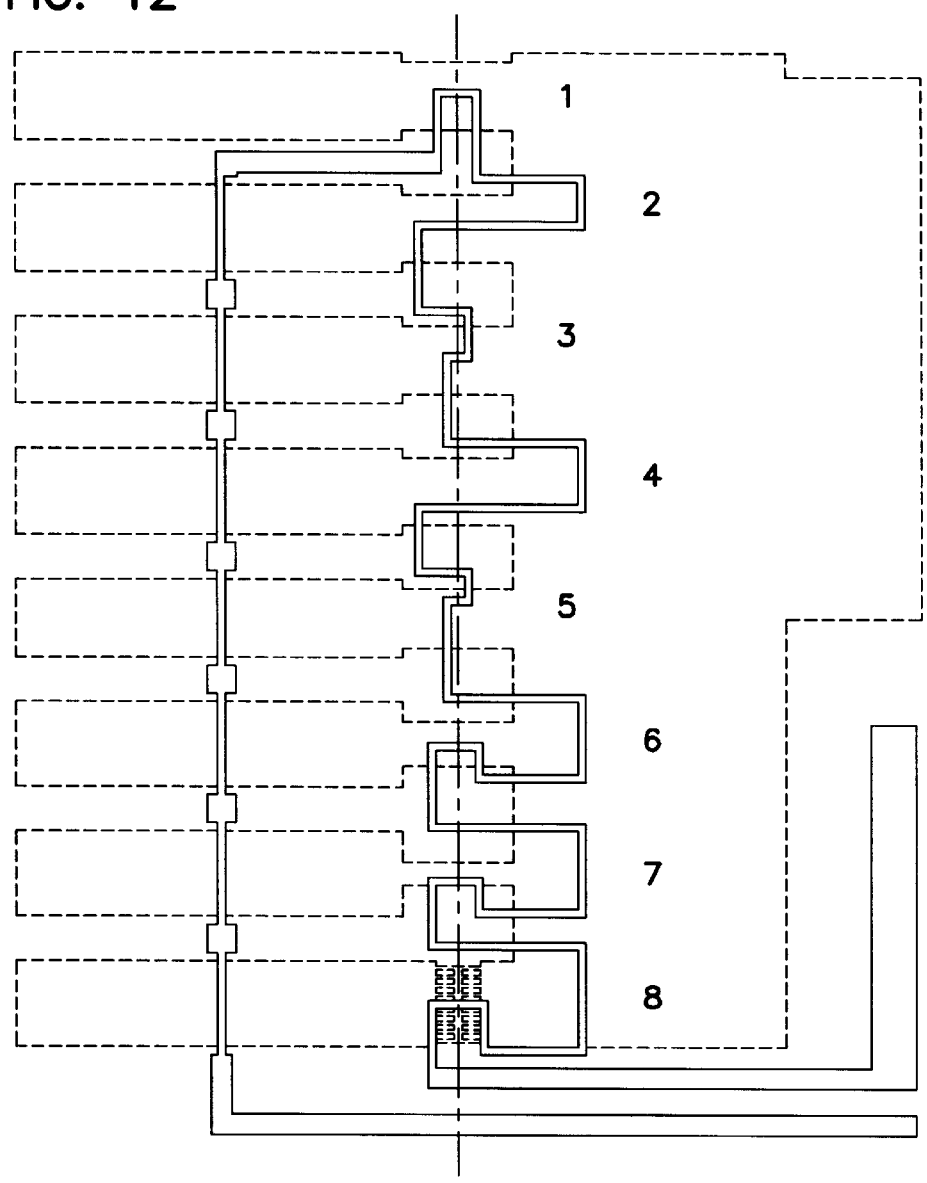
FIG. 12 is an enlarged representation of eight three-terminal devices with 30 μm bicrystal junctions and with differing asymmetric control line configurations constructed according to the principles of this invention.

A 200 nm thick insulating layer of $SiO_2$ was deposited over the Josephson junctions. A 700 nm thick, 3 μm wide gold control line was then deposited over the insulating layer in the eight different device patterns displayed in FIG. 12.

Current was provided in the control line of an amplitude between −2.5 and +2.5 mA. The critical current of the junctions was measured for the upper five devices of the FIG. 12 configuration as a function of the control current at a temperature of 30 K. The gain of each device was then calculated from this data. The maximum gain and maximum critical current for the five junctions identified as "1" through "5" are shown in the following table.

| Junction | Gain | $I_c$(mA) |
|---|---|---|
| 1 | 2.7 | 4.3 |
| 2 | 2.8 | 4.8 |
| 3 | 3.0 | 4.2 |
| 4 | 2.1 | 4.0 |
| 5 | 2.8 | 3.6 |

EXAMPLE 6

A Three-Terminal Device with an SNS Josephson Junction

A three-terminal device with an SNS edge Josephson junction of the type generally illustrated in FIG. 4 was made as described above and in the copending application of Char et al., U.S. Ser. No. 08/345,318. The junction was made on a lanthanum aluminate (LAO) substrate. The first layer of YBCO was epitaxially deposited on the substrate by laser deposition to a thickness of 200 nm. An insulating layer of STO was then deposited over the top of this superconducting layer. Next, the first superconducting layer was patterned using a standard lithography technique.

A barrier layer of Co-doped YBCO was then deposited over the entire surface to a thickness of 20 nm. Next, a second superconducting layer of YBCO was deposited to a thickness of 200 nm. An 200 nm thick layer of SiO insulator layer was deposited over the second YBCO layer as generally shown in FIG. 4. Finally, a 700 nm thick gold control line with a width of 3 μm was added over the second insulating layer in the manner depicted in FIG. 4 and crossing the Josephson junction in a pattern as generally shown in FIG. 1. The width of the Josephson Junction was 30 μm.

Current was provided in the control line with an amplitude of between −2.5 and +2.5 mA. The critical current of the junctions was measured as a function of the control current at a temperature of 50 K. The gain of the device was then calculated from this data. The maximum gain was 2.5 and the maximum critical current was 5.25 mA.

EXAMPLE 7

An XOR Gate Created Using Superconducting Three-Terminal Device

An XOR gate with a bicrystal Josephson junction similar to that described above and with reference to FIG. 11b was constructed. Two 700 nm thick and 3 μm wide gold control lines and a 700 nm thick, 3 μm wide bias field line were deposited on the junction in the pattern shown in FIG. 11b. The device was cooled to 65 K.

Figure 14:
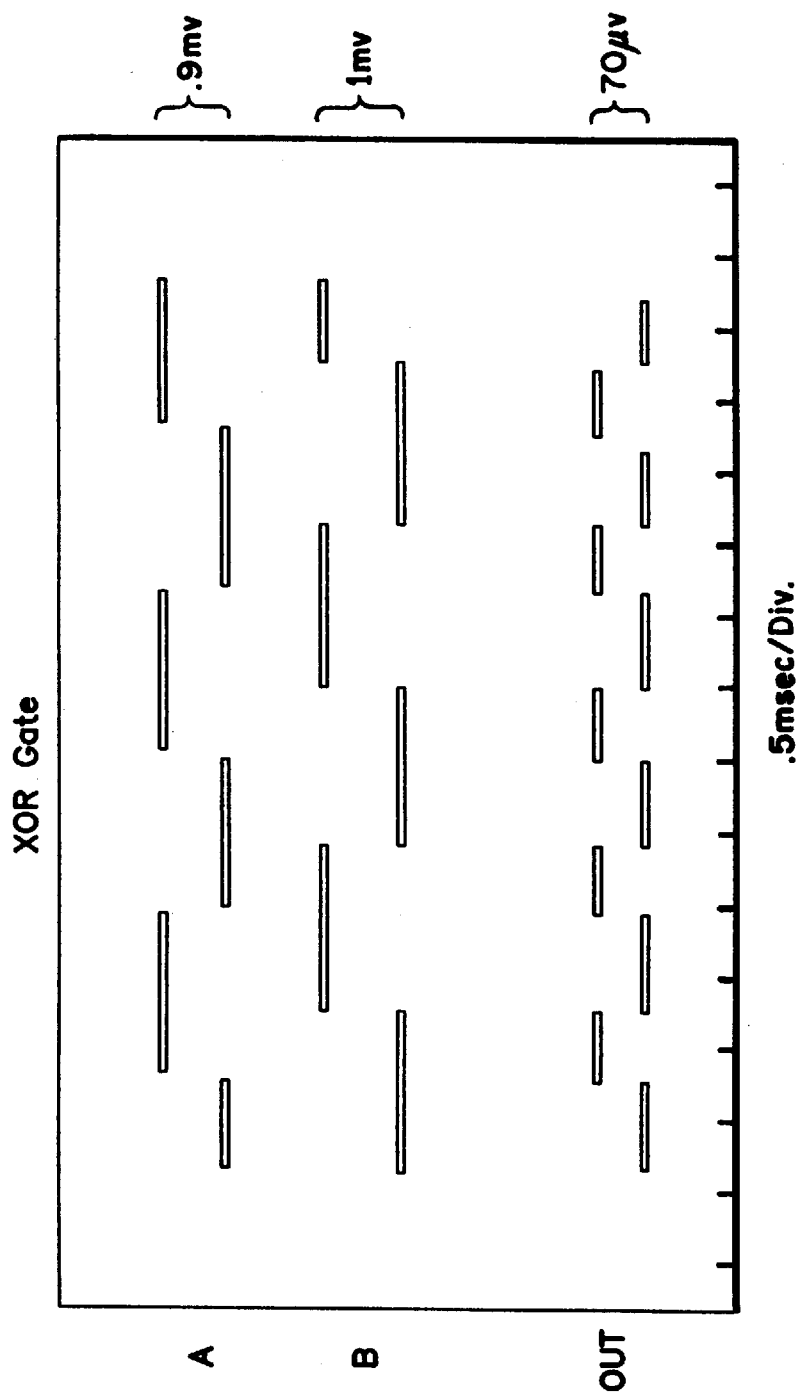
FIG. 14 represents a plot- of the input and output characteristics of an XOR logic gate of the type depicted in FIGS. 11a or 11b for two control lines A and B.

The bias current of the Josephson junction was 0.3 mA. A signal of about 1 mA was applied to either control line to indicate a logical "1" state. The input and output signals of this XOR gate are depicted in FIG. 14.

The above specification, examples and data provide a complete description of the manufacture and use of the invention. Since many embodiments of the invention can be made without departing from the spirit and scope of the invention, the invention resides in the claims hereinafter appended.

I claim:

1. A three-terminal device comprising:
   (a) a substrate;
   (b) a high temperature superconductor material disposed on said substrate in a pattern of a wide Josephson junction;
   (c) a bias lead means operatively connected to said high temperature superconductor material for biasing said Josephson junction;
   (d) at least one conducting means, wherein a portion of said conducting means is directly above or below said Josephson junction, wherein said portion is at least partially capable of carrying a current in a direction parallel to a current flow across said Josephson junction; and
   (e) an insulating layer between said conducting means and said Josephson junction, said insulating layer being of a thickness such that said conducting means is electrically isolated from said Josephson junction but still magnetically coupled to said Josephson junction.

2. The three-terminal device of claim 1 wherein said Josephson junction is of a bicrystal type.

3. The three-terminal device of claim 1 wherein said Josephson junction is of an SNS type.

4. The three-terminal device of claim 1 wherein at least one of said conducting means is directly above said Josephson junction.

5. The three-terminal device of claim 1 wherein said portion of said conducting means crosses said Josephson junction generally perpendicularly.

6. The three-terminal device of claim 5 wherein said portion of said conducting means crosses near a center of said Josephson junction.

7. The three-terminal device of claim 1 further comprising a superconducting ground plane and an insulating layer overlying said ground plane interposed between said substrate and said Josephson junction.

8. A three terminal device comprising:
   (a) a wide Josephson junction;
   (b) bias lead means operatively connected to said Josephson junction for biasing said junction;
   (c) at least one conducting means directly above or below said Josephson junction, said conducting means being electrically isolated from said Josephson junction but still inductively coupled to said Josephson junction; and
   (d) wherein said conductive means has a current flow that is at least partially parallel or antiparallel to current flow across said Josephson junction.

9. A method of operating the device of claims 1 or 8 comprising:

(a) biasing the Josephson junction with a bias current, $I_b$, said bias current being less than the critical current, $I_c$, said critical current being the maximum current at which the Josephson junction remains superconducting; and
   (b) applying a current to said conducting means to alter said critical current to a new value, $I_c'$, such that either
      (i) $I_b < I_c'$, in which case the device remains superconducting, or
      (ii) $I_b > I_c'$, in which case the device becomes resistive.

10. The method of claim 9 further comprising the step of providing a dc bias field to the Josephson junction.

11. A logic gate comprising the three-terminal device of claims 1 or 8.

12. The logic gate of claim 11 wherein the three-terminal device comprises two conducting means and the logic gate is of the XOR or OR type.

13. The logic gate of claim 12 wherein there are two conducting means.

14. The logic gate of claim 13 wherein the two conducting means are proximate to one another.

15. The logic gate of claim 13 wherein the two conducting means are each attached to separate current sources, said current sources providing current such that a direction of current flow in one conducting means is opposite to that in the other conducting means.

16. The logic gate of claim 13 wherein the two conducting means are each attached to separate current sources, said current sources providing current such that a direction of current flow in one conducting means is in the same direction as that in the other conducting means.

17. The logic gate of claim 11 further comprising a bias field means a portion of which is provided above or below said Josephson junction to generate a dc bias field in said Josephson junction.

18. A multi-terminal device, comprising:
   (a) a wide Josephson junction including high temperature superconductor material;
   (b) a bias lead operatively connected to the high temperature superconductor material for biasing the Josephson junction;
   (c) at least one control line, wherein a portion of the control line is directly above or below the Josephson junction, wherein the portion is at least partially capable of carrying a current in a direction parallel to a current flow across the Josephson junction; and
   (d) an insulating layer between the control line and the Josephson junction, the insulating layer having a thickness such that the control line is electrically isolated from the Josephson junction but still magnetically coupled to the Josephson junction.

19. The three-terminal device of claim 18, further comprising a substrate with the high temperature superconductor material disposed over the substrate according to a pattern to form the wide Josephson junction.

20. The multi-terminal device of claim 18, wherein the multi-terminal device comprises at least two control lines each having a portion that is directly above or below the Josephson junction, wherein the portion of each of the at least two control lines is at least partially capable of carrying a current in a direction parallel to a current flow across the Josephson junction.

21. A logic gate comprising the three-terminal device of claim 18.

22. The logic gate of claim 21, wherein the logic gate comprises at least two control lines having a portion that is directly above or below the Josephson junction, wherein the portion of each of the at least two control lines is at least partially capable of carrying a current in a direction parallel to a current flow across the Josephson junction.

23. The logic gate of claim 22, wherein the logic gate is of the XOR or OR type.

24. A method of operating the device of claim 18 comprising:

(a) biasing the Josephson junction with a bias current, $I_b$, the bias current being less than the critical current, $I_c$, the critical current being the maximum current at which the Josephson junction remains superconducting; and (b) applying a current to the control line to alter the critical current to a new value, $I_c'$, such that either (i) $I_b < I_c'$, in which case the device remains superconducting, or (ii) $I_b > I_c'$, in which case the device becomes resistive.

* * * * *

UNITED STATES PATENT AND TRADEMARK OFFICE
CERTIFICATE OF CORRECTION

PATENT NO. : 5,831,278

DATED : NOVEMBER 3, 1998

INVENTOR(S) : BERKOWITZ

It is certified that error appears in the above-identified patent and that said Letters Patent is hereby corrected as shown below:

Col. 11, line 36: "IC" should read —$I_c$—

Col. 13, lines 27-29, claim 1: replace ", wherein said portion is at least partially capable of carrying a current in a direction parallel to a current flow across said" with —and crosses the—

Col. 13, lines 63-65, claim 8: replace "has a current flow that is at least partially parallel or antiparallel to current flow across" with —crosses—

Col. 14, line 7, claim 9: replace "either" with —one of the following:—

Col. 14, line 17, claim 12: replace "of the" with —one of the following:—

Col. 14, lines 45-47, claim 18: replace ", wherein the portion is at least partially capable of carrying a current in a direction parallel to a current flow across" with —and crosses—

Col. 14, lines 60-62, claim 20: replace ", wherein the portion of each of the at least two control lines is at least partially capable of carrying a current in a direction parallel to a current flow across" with —and crosses—

UNITED STATES PATENT AND TRADEMARK OFFICE
CERTIFICATE OF CORRECTION

PATENT NO. : 5,831,278

DATED : NOVEMBER 3, 1998

INVENTOR(S) : BERKOWITZ

It is certified that error appears in the above-identified patent and that said Letters Patent is hereby corrected as shown below:

Col. 15, lines 1-4, claim 22: replace ", wherein the portion of each of the at least two control lines is at least partially capable of carrying a current in a direction parallel to a current flow across" with —and crosses—

Col. 15, line 6, claim 23: replace "of the" with —one of the following:—

Col. 16, line 4, claim 24: replace "either" with —one of the following:—

Signed and Sealed this

Twentieth Day of June, 2000

Attest:

Q. TODD DICKINSON

*Attesting Officer*          *Director of Patents and Trademarks*